US012671226B2

(12) United States Patent
Tomonari et al.

(10) Patent No.: US 12,671,226 B2
(45) Date of Patent: Jun. 30, 2026

(54) LIGHT-EMITTING DEVICE AND METHOD OF MANUFACTURING LIGHT-EMITTING DEVICE

(71) Applicant: NICHIA CORPORATION, Anan (JP)

(72) Inventors: Masakatsu Tomonari, Anan (JP); Naruhito Hosokawa, Anan (JP); Jun Kawamata, Tokushima (JP); Takeshi Nishi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 1042 days.

(21) Appl. No.: 17/839,411

(22) Filed: Jun. 13, 2022

(65) Prior Publication Data

US 2022/0399697 A1 Dec. 15, 2022

(30) Foreign Application Priority Data

Jun. 15, 2021 (JP) ................................. 2021-099644

(51) Int. Cl.
| | |
|---|---|
| *H01S 5/0236* | (2021.01) |
| *H01S 5/02216* | (2021.01) |
| *H01S 5/02253* | (2021.01) |
| *H01S 5/02255* | (2021.01) |
| *H01S 5/02315* | (2021.01) |
| *H01S 5/02345* | (2021.01) |

(Continued)

(52) U.S. Cl.
CPC ........ *H01S 5/0236* (2021.01); *H01S 5/02216* (2013.01); *H01S 5/02253* (2021.01); *H01S 5/02255* (2021.01); *H01S 5/02315* (2021.01);

*H01S 5/0239* (2021.01); *H01S 5/4031* (2013.01); *H01S 5/02345* (2021.01)

(58) Field of Classification Search
CPC ............. H01S 5/02216; H01S 5/02253; H01S 5/02255
See application file for complete search history.

(56) References Cited

U.S. PATENT DOCUMENTS

| | | |
|---|---|---|
| 6,004,046 A | 12/1999 | Sawada |
| 2001/0025650 A1 | 10/2001 | Ando et al. |

(Continued)

FOREIGN PATENT DOCUMENTS

| | | |
|---|---|---|
| JP | H06-12445 A | 1/1994 |
| JP | H06-331869 A | 12/1994 |

(Continued)

*Primary Examiner* — Joshua King
(74) *Attorney, Agent, or Firm* — Spencer Fane LLP

(57) ABSTRACT

A light-emitting device includes a base structure, a light-emitting element, an optical member, and first and second adhesive parts. The first adhesive parts are disposed in first and second regions of a second surface of the base structure. The second adhesive parts are located at both opposite sides of the first adhesive part without being in contact with the first adhesive part. In the top view, a virtual first line segment, which connects two points respectively on the first adhesive parts in the first and second regions, extends across a first surface of the base structure. A virtual line segment, which connects two points respectively on the second adhesive parts at the both opposite sides of the first adhesive part, does not extend across the first surface. A width of the first adhesive part along the line segment is greater than a width of the second adhesive part.

10 Claims, 9 Drawing Sheets

(51) Int. Cl.
    *H01S 5/0239*       (2021.01)
    *H01S 5/40*         (2006.01)

(56)           References Cited

U.S. PATENT DOCUMENTS

| | | | |
|---|---|---|---|
| 2002/0003705 A1* | 1/2002 | Tanaka | H10F 77/407 |
| | | | 257/E31.127 |
| 2002/0020493 A1 | 2/2002 | Ichihara | |
| 2005/0190683 A1 | 9/2005 | Ando | |
| 2006/0159406 A1* | 7/2006 | Nishie | G02B 6/4292 |
| | | | 385/88 |
| 2010/0232750 A1 | 9/2010 | Mizue et al. | |
| 2011/0280270 A1* | 11/2011 | Hayashi | H01S 5/0232 |
| | | | 372/50.1 |
| 2011/0317965 A1 | 12/2011 | Fujimura et al. | |
| 2012/0033695 A1* | 2/2012 | Hayashi | H01S 5/0232 |
| | | | 372/43.01 |
| 2012/0033696 A1* | 2/2012 | Hayashi | H01S 5/0232 |
| | | | 372/43.01 |
| 2012/0313203 A1* | 12/2012 | Fuse | H01L 24/97 |
| | | | 257/E31.127 |
| 2017/0317467 A1 | 11/2017 | Miura et al. | |
| 2018/0182928 A1* | 6/2018 | Namie | H01S 5/02253 |
| 2018/0254604 A1* | 9/2018 | Matsushita | H01S 5/02469 |
| 2018/0287335 A1* | 10/2018 | Kozuru | H01S 5/3013 |
| 2019/0189659 A1 | 6/2019 | Matsuzawa | |
| 2019/0195442 A1 | 6/2019 | Miura | |
| 2019/0278104 A1* | 9/2019 | Chen | G02C 7/02 |
| 2019/0368685 A1* | 12/2019 | Miura | G02B 19/0052 |
| 2021/0231933 A1* | 7/2021 | Kai | H01S 5/4025 |

FOREIGN PATENT DOCUMENTS

| | | | | | |
|---|---|---|---|---|---|
| JP | H08-234059 | A | | 9/1996 | |
| JP | H10-213724 | A | | 8/1998 | |
| JP | H11-176851 | A | | 7/1999 | |
| JP | 2000131583 | A | * | 5/2000 | |
| JP | 2000-155251 | A | | 6/2000 | |
| JP | 2001-281505 | A | | 10/2001 | |
| JP | 2002-090587 | A | | 3/2002 | |
| JP | 2005-227365 | A | | 8/2005 | |
| JP | 2006-085003 | A | | 3/2006 | |
| JP | 2006190783 | A | * | 7/2006 | G02B 6/4292 |
| JP | 2006-201392 | A | | 8/2006 | |
| JP | 2007109302 | A | * | 4/2007 | |
| JP | 2007-127925 | A | | 5/2007 | |
| JP | 2007-139877 | A | | 6/2007 | |
| JP | 2008-116553 | A | | 5/2008 | |
| JP | 2010-210920 | A | | 9/2010 | |
| JP | 2012-023325 | A | | 2/2012 | |
| JP | 2013004534 | A | * | 1/2013 | H10F 77/50 |
| JP | 2014027096 | A | | 2/2014 | |
| JP | 2014082452 | A | * | 5/2014 | |
| JP | 2017-032871 | A | | 2/2017 | |
| JP | 2017-201684 | A | | 11/2017 | |
| JP | 2018170426 | A | * | 11/2018 | H01S 5/02216 |
| JP | 2019-110429 | A | | 7/2019 | |
| JP | 2019-114726 | A | | 7/2019 | |
| TW | I838972 | B | * | 4/2024 | H10H 20/8506 |
| WO | WO-2021085071 | A1 | * | 5/2021 | H10H 20/8506 |
| WO | WO-2023149250 | A1 | * | 8/2023 | H01S 5/02253 |

* cited by examiner

LIGHT-EMITTING DEVICE AND METHOD OF MANUFACTURING LIGHT-EMITTING DEVICE

CROSS-REFERENCE TO RELATED APPLICATION

This application claims priority to Japanese Patent Application No. 2021-099644 filed on Jun. 15, 2021, the disclosure of which is hereby incorporated herein by reference in its entirety.

BACKGROUND

Technical Field

The present invention relates to a light-emitting device, and a method of manufacturing a light-emitting device.

Background Art

Japanese Laid-Open Patent Application Publication No. 2017-201684 discloses bonding a base structure, in which a light-emitting element is disposed in an airtightly sealed space, and an optical member using an ultraviolet curing resin adhesive agent after adjusting their positions. In the manner shown in Japanese Laid-Open Patent Application Publication No. 2017-201681, it is possible to adjust the position and perform the fixing, so that mounting can be performed with good precision.

A light-emitting device having a light-emitting element such as a semiconductor laser element, etc., can be used incorporated in various products such as projectors, vehicle headlights, etc.

SUMMARY

A light-emitting device with a stable adhesive state will be obtained.

The light-emitting device disclosed in one embodiment includes: a base structure, one or more light-emitting elements, an optical member, a plurality of first adhesive parts, and a plurality of second adhesive parts. The base structure has a first surface, and a second surface positioned higher than the first surface and surrounding the first surface in a top view. The second surface includes a first region and a second region. One or more light-emitting elements are arranged on the first surface. The optical member is bonded to the base structure so as to at least partially overlap the first surface in the top view. The first adhesive parts are formed by curing a first adhesive agent. The first adhesive parts are disposed respectively in the first region and the second region of the second surface at positions between the second surface and the optical member and fixing the optical member to the base structure. The second adhesive parts are formed by curing a second adhesive agent different from the first adhesive agent. The second adhesive parts are disposed such that a pair of the second adhesive parts are respectively located at both opposite sides of a corresponding one of the first adhesive parts in the first region on the second surface without being in contact with the corresponding one of the first adhesive parts and another pair of the second adhesive parts are respectively located at both opposite sides of a corresponding one of the first adhesive parts in the second region on the second surface without being in contact with the corresponding one of the first adhesive parts. In the top view, a virtual first line segment, which connects two points respectively on the first adhesive parts in the first region and the second region, extends across the first surface. In the top view, a virtual second line segment, which connects two points respectively on the pair of the second adhesive parts at the both opposite sides of the corresponding one of the first adhesive parts in the first region, does not extend across the first surface. In the top view, a virtual third line segment, which connects two points respectively on the another pair of the second adhesive parts at the both opposite sides of the corresponding one of the first adhesive parts in the second region, does not extend across the first surface. In the top view, a width of the corresponding one of the first adhesive parts in the first region in a direction parallel to the second line segment is greater than a width of each of the pair of the second adhesive parts at the both opposite sides of the corresponding one of the first adhesive parts in the first region in the direction parallel to the second line segment. In the top view, a width of the corresponding one of the first adhesive parts in the second region in a direction parallel to the third line segment is greater than a width of each of the another pair of the second adhesive parts at the both opposite sides of the corresponding one of the first adhesive parts in the second region in the direction parallel to the third line segment.

The method of manufacturing a light-emitting device disclosed in one embodiment includes: arranging one or more light-emitting elements on a first surface of a base structure having the first surface and a second surface that is positioned higher than the first surface and that surrounds the first surface in a top view, the second surface including a first region and a second region; disposing a first adhesive agent and a second adhesive that is different from the first adhesive agent such that the first adhesive agent is located on the first region and the second region on the second surface, and the second adhesive agent is disposed in at least at two locations at both opposite sides of the first adhesive agent in the first region without being in contact with the first adhesive agent in the first region, and in at least at two locations at both opposite sides of the first adhesive agent in the second region without being in contact with the first adhesive agent in the second region; curing the first adhesive agent in a state in which an optical member is in contact with the first adhesive agent and second adhesive agent to form first adhesive parts in the first region and the second region resulting from the curing of the first adhesive agent; and curing the second adhesive agent in a state in which the first adhesive parts are formed to form second adhesive parts resulting from the curing of the second adhesive agent. The disposing of the first adhesive agent and the second adhesive agent includes disposing the first adhesive agents and the second adhesive agents such that in the top view, a virtual first line segment, which connects two points respectively on the first adhesive parts in the first region and the second region, extends across the first surface, in the top view a virtual second line segment, which connects two points respectively on the second adhesive parts at the both opposite sides of a corresponding one of the first adhesive parts in the first region, does not extend across the first surface, in the top view, a virtual third line segment, which connects two points respectively on the second adhesive parts at the both opposite sides of a corresponding one of the first adhesive parts in the second region, does not extend across the first surface, in the top view, a width of the corresponding one of the first adhesive parts in the first region in a direction parallel to the second line segment is greater than a width of each of the second adhesive parts at the both opposite sides of the corresponding one of the first adhesive parts in the first region in the direction parallel to the second line segment, and in the top view, a width of the corresponding one of the first adhesive parts in the second region in a direction parallel to the third line segment is greater than a width of each of the second adhesive parts at the both opposite sides of the corresponding one of the first adhesive parts in the second region.

According to certain embodiments of the present invention, it is possible to realize a light-emitting device with a stable adhesive state.

BRIEF DESCRIPTION OF TILE DRAWINGS

DETAILED DESCRIPTION

Figure 1:
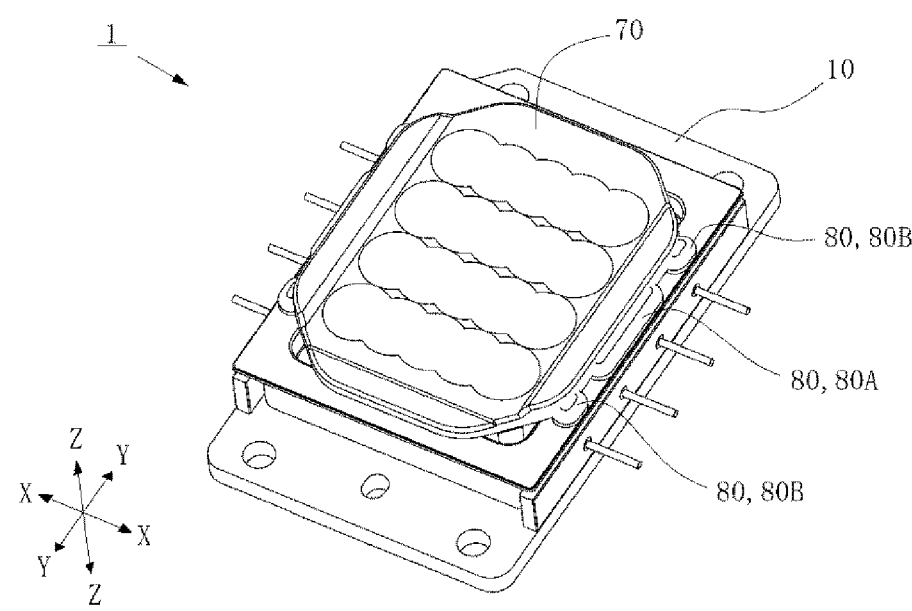
FIG. 1 is a schematic perspective view of a light-emitting device according to an embodiment.

In the present specification or the claims, as for polygonal shapes, such as triangular shapes, rectangular shapes, quadrangular shapes, and octagonal shapes, polygonal shapes with rounded corners, beveled corners, angled corners, reverse-rounded corners are also referred to as polygonal shapes. Not only shapes with such modification at corners (end of sides) but also shapes with modifications at intermediate portions of sides of the shape will be also referred to as polygons. That is, shapes that are based on polygonal shapes and partially modified are within the interpretation of the term "polygon" (a triangle, a rectangle, an octagon, etc.) in the present specification and the claims.

The same applies not only to polygons, but also to words expressing specific shapes such as trapezoids, circles, recesses, and projections, etc. The same applies when dealing with each side forming the shape. That is, even if an end or an intermediate portion of a side is modified, the modified portion is interpreted as a portion of a "side." When "polygonal shapes" and "sides" without such modified portions are intended to be distinguished from those with modifications, the term "exact" is added, such as an "exact quadrangular shape."

In the present specification or claims, terms such as upper-lower, left-right, front-back, front-rear, near side and far side, etc., are intended to describe a relationship such as relative position, orientation, direction, etc., and does not necessarily coincide with the relationship at the time of use.

Arrows may be used to indicate directions such as the X direction, Y direction, Z direction, etc., in the drawings. The direction of the arrows are consistent between multiple drawings for the same embodiment.

In the present specification, for example when explaining constituent elements, etc., "member", "part", or "portion" may be used. The term "member" indicates an object treated as a physically single unit. An object that is treated as a physically single unit can also be referred to as an object that is treated as a single component in the manufacturing process. On the other hand, the term "part" or "portion" indicates an object that does not have to be treated as a physically single item. For example, the term "portion" can be used to partially grasp a part of one member.

The distinction between "member", "part", and "portion" described above does not indicate the intention to intentionally limit the scope of rights in the interpretation of the doctrine of equivalents. In other words, even if there is a constituent element designated as a "member" in the claims, such designation does not indicate that the applicant recognizes that treatment of this component as a physically single component is essential for application of the present invention.

Also, in the present specification or the claims, when there is a plurality of certain constituent elements and these are described to be distinguished from each other, "first", "second", etc., may be added before the name of the constituent element to distinguish them. In addition, the object of distinction may be different between the present specification and the claims. Accordingly, even when a constituent element described in the claims is indicated by the same term as in the present specification, the object specified by the component may differ between the present specification and the claims.

For example, when there are constituent elements distinguished by using terms "first," "second," and "third," in the present specification and the constituent elements with "first" and "third" in the present specification are to be described in the claims, in view of conciseness, the constituent elements may be distinguished in the claims by using "first" and "second." In this case, each of the constituent elements with terms "first" and "second" in the claims indicate elements with "first" and "third" in the present specification. The objects to which this rule applies are not limited to constituent elements, and it is reasonably and flexibly applied to other objects as well.

Certain embodiments of the present invention will be described below. Furthermore, specific modes of the present invention are explained while referring to the drawings. The embodiments of the present invention are not limited to these specific modes. In other words, the illustrated embodiments are not the only modes that can be realized by the present invention. The size, positional relationship, etc., of the members shown in each drawing may be exaggerated for ease of understanding.

Embodiment

A light-emitting device 1 according to one embodiment is explained.

Figure 2:
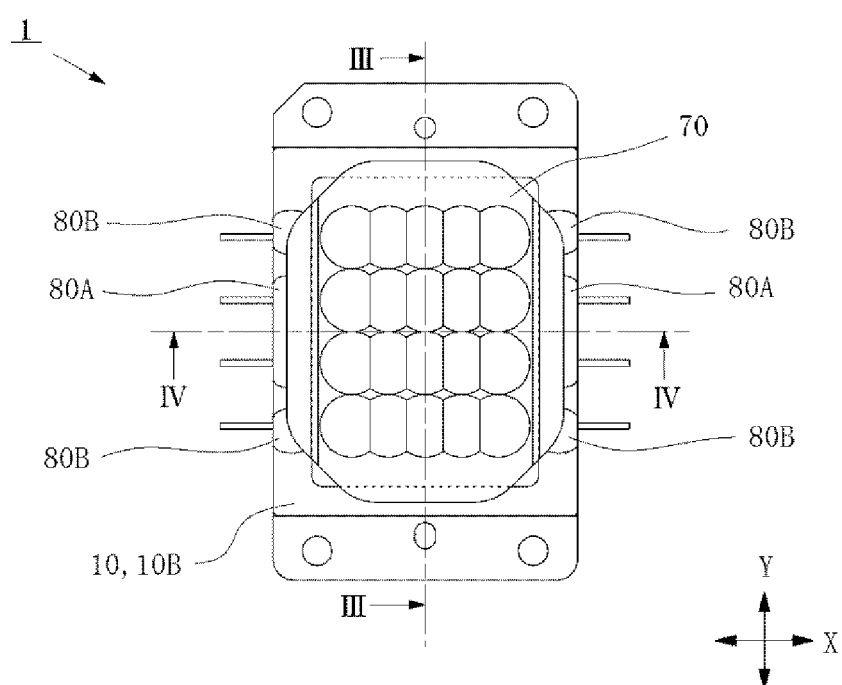
FIG. 2 is a schematic top view of the light-emitting device according to the embodiment.
Figure 3:
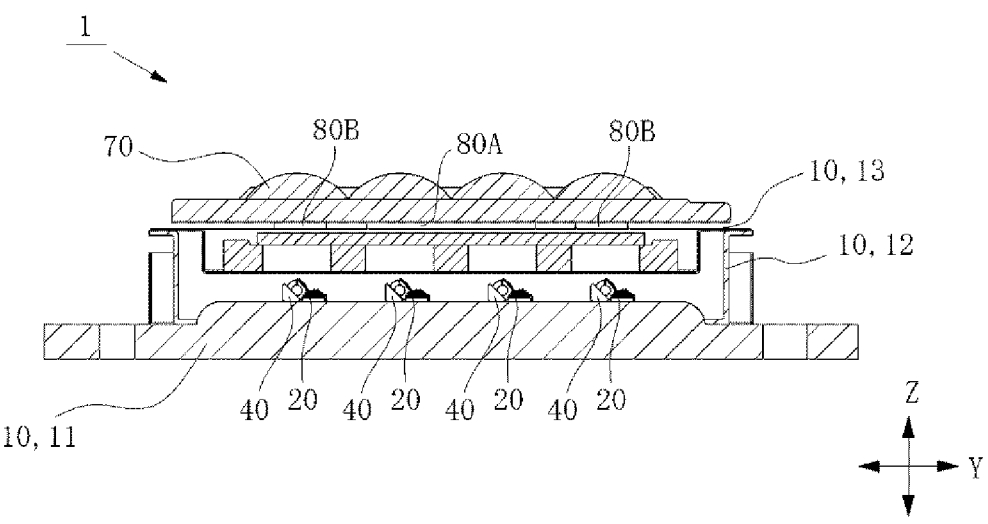
FIG. 3 is a schematic cross-sectional view of the light-emitting device in line III-III of FIG. 2.
Figure 4:
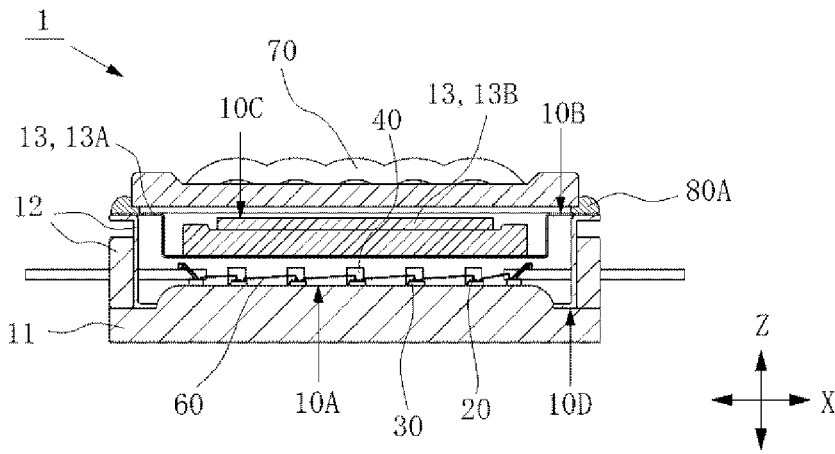
FIG. 4 is a schematic cross-sectional view of the light-emitting device in line IV-IV of FIG. 2.

FIG. 1 to FIG. 9 are drawings for explaining an exemplary mode of the light-emitting device 1. FIG. 1 is a schematic perspective view of the light-emitting device 1. FIG. 2 is a schematic top view of the light-emitting device 1. A portion of the inner edge of a second upper surface 10B of a base structure 10 overlapping an optical member 70 is indicated by dotted lines. FIG. 3 is a cross-sectional view of line III-III of FIG. 2. FIG. 4 is a cross-sectional view of line IV-IV of FIG. 2. From FIG. 5A to FIG. 5D are schematic diagrams of the manufacturing process for explaining the method of manufacturing the light-emitting device 1. FIG. 6 to FIG. 9 are graphs relating to experiment results in which the resistance of an adhesive agent to light was measured.

The light-emitting device 1 comprises a plurality of elements.

The plurality of elements of the light-emitting device 1 includes a base structure 10, one or a plurality of light-emitting elements 20, one or a plurality of submounts 30, one or a plurality of reflective members 40, a plurality of wirings 60, an optical member 70, a first adhesive part 80A, and second adhesive parts 80B.

The light-emitting device 1 may further comprise other elements.

For example, the light-emitting device 1 may further comprise a light-emitting element other than the light-emitting element 20. In one embodiment, the light-emitting device 1 does not need to comprise some of the elements described above.

Hereafter, elements of the light-emitting device 1 will be explained, and then the light-emitting device 1 will be explained.

Base Structure 10

The base structure 10 has a first upper surface 10A, and a second upper surface 10B positioned above the first upper surface 10A. The second upper surface 10B surrounds the first upper surface 10A in the top view. The base structure 10 can have a third upper surface 10C positioned between the first upper surface 10A and the second upper surface 10B. The second upper surface 10B surrounds the third upper surface 10C in the top view. The base structure 10 can have a fourth upper surface 10D positioned below the first upper surface 10A. The base structure 10 has a lower surface, a plurality of outer lateral surfaces, and a plurality of inner lateral surfaces.

The base structure 10 has a surface shape that forms a recessed shape. The first upper surface 10A is one surface among a plurality of surfaces that define a recess forming the recessed shape. In the top view, the outer edge of the recess is rectangular. In the top view, the second upper surface 10B is positioned outward of the outer edge of the recess. In the top view, the frame-shaped region that surrounds the first upper surface 10A (hereafter referred to as the "frame-shaped region") is formed by the upper surfaces located outward of the recess. The second upper surface 10B can serve as such a frame-shaped region.

In the top view, the outer edge shape of the second upper surface 10B is rectangular. In the top view, the second upper surface 10B is formed in a rectangular frame shape. The rectangle of the second upper surface 10B is formed by a first side and second side that are mutually opposite sides, and a third side and fourth side that are mutually opposite sides. The rectangle of the second upper surface 10B can have long sides and short sides. In this case, the first side and the second side are the long sides, and the third side and the fourth side are the short sides. The frame-shaped region can be a region that includes the first to fourth sides.

Because the second upper surface 10B has an area dimension, the rectangular frame shape can also be regarded as band-shaped (a shape having width) rather than linear-shaped. For that reason, it is possible to specify the first to fourth sides described above as having area dimensions rather than being lines.

Each side can be substantially specified according to the present embodiment.

In one example, a straight line that connects a corner formed by adjacent inner edges of the frame-shaped second upper surface 10B and a corner of outer edges closest to the corner formed by the inner edges can be found for all the corners, and boundaries between respective adjacent sides can be specified by these straight lines. Alternatively, a region with a predetermined width from an outer edge of the second upper surface 10B can serve as the frame-shaped region, and a "side" can be specified by a region with the predetermined width from an outer edge of the second upper surface 10B corresponding to the side. In this case, a portion of the corner portion of the frame-shaped region is shared between sides that form the same corner. The predetermined width can be a length of $\frac{1}{15}$ or greater to $\frac{1}{5}$ or less of the length of the external shape of the second upper surface 10B in the direction perpendicular to the outer edge of the side in the top view. The width of the frame of the frame-shaped region can be a length of $\frac{1}{15}$ or greater and $\frac{1}{5}$ or less of the length of the external shape of the frame-shaped region of the direction perpendicular to the outer edge of the side.

The base structure 10 can be configured including a base portion 11 and a lateral portion 12. The base structure 10 can further be configured including a cover 13. The base portion 11 has the first upper surface 10A. The lateral portion 12 is connected to the base portion 11, and surrounds the first upper surface 10A in the top view. The lateral portion 12 forms a lateral wall extending upward from the base portion 11. The cover 13 is connected to the lateral portion 12.

The base portion 11, the lateral portion 12, and the cover 13 are each configured by different members, and these can be joined to form the base structure 10. For example, the base portion 11 and the lateral portion 12 may also be formed integrally of the same material. Also, for example, the lateral portion 12 and the cover 13 may be formed integrally of the same material.

The base portion 11 has a projecting shape. An upper surface of the projecting portion can be the first upper surface 10A, and an upper surface of the portion that does not project can be the fourth upper surface 10D. In the top view, the fourth upper surface 10D surrounds the first upper surface 10A. The base portion 11 can be formed using a metal such as copper, etc., as the main material.

As used herein, the term "main material" refers to a material that occupies the greatest proportion by mass or volume in an object to be obtained. When the object to be obtained is formed from a single material, the single material is the main material. In other words, the expression "a certain material being the main material" includes a case in which the proportion occupied by that material is 100%.

The lateral portion 12 can be connected to the fourth upper surface 10D. The lateral portion 12 has a rectangular frame shape in the top view. A plurality of lead pins is provided in the lateral wall part corresponding to two sides of the rectangle that are opposite to each other. The plurality of lead pins is provided to penetrate the lateral wall. Each lead pin can be used as a wiring. The lateral portion 12 can be formed using an alloy containing iron. An insulating material is provided between each lead pin and the lateral portion 12, and the lateral portion 12 and the lead pins are not electrically connected.

The cover 13 can include a frame member 13A and a light-transmissive member 13B. The cover 13 can have the second upper surface 10B.

The cover 13 can have a frame-shaped region.

The frame member 13A can have the second upper surface 10B. The frame member 13A can form a frame-shaped region. The frame member 13A is joined to the lateral portion 12, and the light-transmissive member 13B is joined to the frame member 13A. The frame member 13A can be formed using a metal such as an alloy of iron and nickel as the main material. The frame member 13A can be configured from a plurality of components. The light-transmissive member 13B can be formed using glass, etc., as the main material.

Other than the description above, and for example, the base portion 11 and the lateral portion 12 may also be formed from a ceramic that uses aluminum nitride, silicon nitride, aluminum oxide, silicon carbide, etc., as the main material. Also, for example, the cover 13 may be formed using sapphire, etc., as the main material.

In the base structure 10, a closed space can be formed inside the base structure 10 by the base portion 11, the lateral portion 12, and the cover 13. This closed space can be a sealed space for which exiting and entering the base structure are substantially limited. Inside the sealed space can be in an airtight state under a specific atmosphere. Alternatively, inside of the sealed space may also be substantially in a vacuum state.

Light-Emitting Element 20

The light-emitting element 20 emits light. The light-emitting element 20 has an upper surface, a lower surface, and one or a plurality of lateral surfaces. One or more suffices among the upper, lower, and one or plurality of lateral surfaces are a light-emitting surface(s) from which light is emitted.

The light-emitting element 20 emits light from one or a plurality of emission points of the light-emitting surface. Such emission points will also be referred to as "light emission points". One specific example of the light-emitting element 20 is a semiconductor laser element.

For the light-emitting element 20, for example, it is possible to use a light-emitting element configured to emit blue light, a light-emitting element configured to emit green light, or a light-emitting element configured to emit red light. For the light-emitting element 20, it is also possible to use a light-emitting element configured to emit another color light.

As used herein, the term "blue light" refers to light with the emission peak wavelength in a range of 420 nm to 494 nm. The term "green light" refers to light with the emission peak wavelength in a range of 495 nm to 570 nm. The term "red light" refers to light with the emission peak wavelength in a range of 605 nm to 750 nm.

Description of the semiconductor laser element will be given below. The semiconductor laser element has a rectangular external shape having two pairs of opposite sides, one pair of the two pair being long sides and the other pair of the two pair being short sides. The semiconductor laser element includes a plurality of semiconductor layers including an active layer laminated in the direction from the lower surface to the upper surface. The lateral surface that includes one side of the two short sides of the rectangle becomes the emission end surface from which light is emitted. The emission end surface of the semiconductor laser element can be called the light-emitting surface of the light-emitting element 20. The upper surface and the lower surface of the semiconductor laser element have a greater surface area than the emission end surface.

Light (laser light) emitted from the semiconductor laser element has expansion. Divergent light is emitted from the emission end surface of the semiconductor laser element. Light emitted from the semiconductor laser element exhibits a far field pattern (hereafter referred to as "FFP") of an elliptic shape on a plane parallel to the emission end surface of the semiconductor laser element. FFP is the shape and light intensity distribution of the emitted light at a position apart from the emission end surface.

In the present specification, light at the center of the elliptic shape of the FFP, said another way, light having the peak intensity in the light intensity distribution of the FFP is referred to as light that travels on the optical axis, or light that travels along the optical axis. In the light intensity distribution of the FFP, light having the intensity of $1/e^2$ or greater with respect to the peak intensity value is referred to as the main portion of light.

The shape of the FFP of light emitted from the semiconductor laser element is an elliptic shape in which the lamination direction is longer than the direction perpendicular to the lamination direction. The lamination direction refers to the direction in which the plurality of semiconductor layers including the active layer are laminated in the semiconductor laser element. The direction perpendicular to the lamination direction can also be called the surface direction of the semiconductor layer. The long diameter direction of the elliptic shape of the FFP can also be referred to as the fast axis direction of the semiconductor laser element, and the short diameter direction can be referred to as the slow axis direction of the semiconductor laser element.

The light emitted from the semiconductor laser element is divergent light. In the present specification, the angle at which the light of light intensity of $1/e^2$ of the peak light intensity expands based on the light intensity distribution of the FFP is used as the light expansion angle of the semiconductor laser element. The light expansion angle can also be found from the light intensity of the half value of the peak light intensity, for example, in addition to the light intensity of $1/e^2$ of the peak light intensity. In the explanation of the present specification, when simply saying, "light expansion angle," this indicates the light expansion angle in the light intensity of $1/e^2$ of the peak light intensity. It can be said that the expansion angle of the fast axis direction is greater than the expansion angle of the slow axis direction.

Examples of a semiconductor laser element configured to emit blue light and a semiconductor laser element configured to emit green light include a semiconductor laser element that contains a nitride semiconductor. As the nitride semiconductor, for example, GaN, InGaN, and AlGaN can be used. Examples of the semiconductor laser element configured to emit red light include a semiconductor laser element containing an InAlGaP-based semiconductor, a GaInP-based semiconductor, a GaAs-based semiconductor, or an AlGaAs-based semiconductor.

Submount 30

The submount 30 has a lower surface, an upper surface, and one or a plurality of lateral surfaces. In the submount 30, the width in the vertical direction is the smallest. The submount 30 is configured in a rectangular solid shape. The shape does not have to be limited to a rectangular solid. The submount 30 can be formed, for example, using aluminum nitride, silicon nitride, or silicon carbide as the main material.

Reflective Member 40

The reflective member 40 has a light reflecting surface that reflects light. The reflective member 40 has a lower surface and an upper surface, and the light reflecting surface is tilted with respect to the lower surface of the reflective member 40. In other words, the light reflecting surface is not perpendicular and not parallel to the lower surface of the reflective member 40. The light reflecting surface is a flat surface, and forms an angle of inclination of 45 degrees with respect to the lower surface of the reflective member 40. The light reflecting surface does not have to be a flat surface, and the angle of inclination does not have to be 45 degrees.

The reflective member 40 can be formed using glass, metal, etc., as the main material. For the main material, a material that is resistant to heat is preferably used, and for example a glass such as quartz or BK7 (borosilicate glass), or a metal such as aluminum, etc., can be used. The reflective member 40 can also be formed using Si as the main material. When the main material is a reflective material, it is possible to form the light reflecting surface from the main material. When forming the light reflecting surface separately from the main material, it is possible to form the light reflecting surface by doing film formation of a metal film of Ag, Al, etc., or of a dielectric multilayer film of $Ta_2O_5/SiO_2$, $TiO_2/SiO_2$, $Nb_2O_5/SiO_2$, etc., for example.

The light reflecting surface has a reflectance of 90% or greater with respect to the peak wavelength of the light irradiated on the light reflecting surface. This reflectance may also be 95% or greater. The reflectance here is 100% or less or less than 100%.

Wiring 60

The wiring 60 is formed of a conductor having a linear shape with both ends as bonding portions. Said another way, the wiring 60 has bonding portions that are bonded with other elements at both ends of the linear part. The wiring 60 is used to electrically connect two elements.

As the wiring 60, for example, it is possible to use a wire for which the main material is a metal. Examples of the metal include gold, aluminum, silver, copper, etc.

Optical Member 70

The optical member 70 has an upper surface, a lower surface, and a lateral surface. The optical member 70 has one or a plurality of lens surfaces. The optical member 70 has an optical characteristics region. The optical characteristics region is a region in which optical characteristics change when the incidence angle or incidence position of light to be incident in this region is deviated. For example, because the optical characteristics change when the lens optical axis or focal point in the lens surface is deviated, the lens surface can be the optical characteristics region. Also, for example, if the A-plane of sapphire is used as the light incident surface, the polarizing characteristics change by rotation of the polarization direction of the incident light, so the A-plane of sapphire can be the optical characteristics region.

The upper surface of the optical member 70 is a flat surface, and one or a plurality of lens surfaces are located at the upper surface side. The one or plurality of lens surfaces can be a curved upper surface different from the upper surface which is a flat surface, but in the description herein, the present embodiment is described assuming that the "upper surface" of the optical member 70 does not indicate the lens surface. The optical member 70 can be configured having a plurality of lens surfaces arranged in N rows and M columns (N is a natural number of 1 or greater, and M is 2 or greater). The lens surface may also be located on the lower surface side. The upper surface and the lower surface are flat surfaces. The plurality of lens surfaces intersect with the upper surface. The plurality of lens surfaces surround the upper surface in the top view. In the top view, the optical member 70 has a rectangular external shape. The lower surface of the optical member 70 is rectangular.

As used herein, in the optical member 70, a portion that overlaps the plurality of lens surfaces in the top view will be referred to as a "lens part". In the optical member 70, the portion that overlaps the upper surface in the top view is the non-lens part. When the lens part is divided in two by a plane including the upper surface, the lens surface side is the lens shaped part, and the lower surface side is the flat plate shaped part. The lower surface of the lens part is one portion of the lower surface of the optical member 70.

The optical member 70 has an outer edge shaped in an octagon shape in the top view. The outer edge shape can be a rectangle, etc., for example, rather than an octagon. The optical member 70 can be formed using a light-transmissive material such as glass, synthetic quartz, etc., as the main material.

(Adhesive Part 80)

The adhesive part 80 is formed by curing an adhesive agent. In other words, the adhesive agent in a cured state is called the adhesive part 80. By adding "first" and "second" such as in a first adhesive part 80A, second adhesive parts 80B, adhesive parts 80 formed by different adhesive agents are referred to by adhesive agent type. Similarly, different types of adhesive agents are also referred to by differentiating such as in first adhesive agent 81, and second adhesive agent 82.

For the second adhesive agent 82, an adhesive agent that has better resistance to light than the first adhesive agent 81 is used. Here, "good resistance to light" means that resistance is good after manufacturing the light-emitting device 1 using the adhesive agent.

In other words, resistance here is resistance in the state of being the adhesive part 80. For example, an adhesive agent with better resistance to visible light (wavelength range of 400 nm or greater and 760 nm or less) than the first adhesive agent 81 is used for the second adhesive agent 82. Also, for example, an adhesive agent with better resistance to blue light than the first adhesive agent 81 is used for the second adhesive agent 82.

For example, the adhesive strength may be impaired by light of energy density ($W/mm^2$) of a predetermined value continuing to be irradiated on the adhesive part 80. When light of the same energy density is irradiated, if the adhesive strength is lost by the first adhesive part 80A in a shorter time than the second adhesive parts 80B, it can be said that the resistance to light of the second adhesive agents 82 is better than that of the first adhesive agent 81.

For example, it is possible to use an ultraviolet curing resin adhesive agent as the first adhesive agent 81, and to use a thermosetting resin adhesive agent as the second adhesive agent 82. The used adhesive agents are not limited to these, and the combination of the first adhesive agent 81 and the second adhesive agent 82 is not limited to this. As the ultraviolet curing resin, it is possible to use an adhesive agent of epoxy resin or acrylate resin. As the thermosetting resin, it is possible to use an adhesive agent of epoxy resin or silicone resin.

Next, the light-emitting device 1 is explained while explaining the manufacturing method.

(Light-Emitting Device 1)

The light-emitting device 1 can be manufactured through a plurality of steps including a step of arranging the light-emitting element 20 on the base structure 10, a step of providing the adhesive agent on the base structure 10, and a step of fixing the optical member 70 to the base structure 10 using the adhesive agent.

Figure 5A:
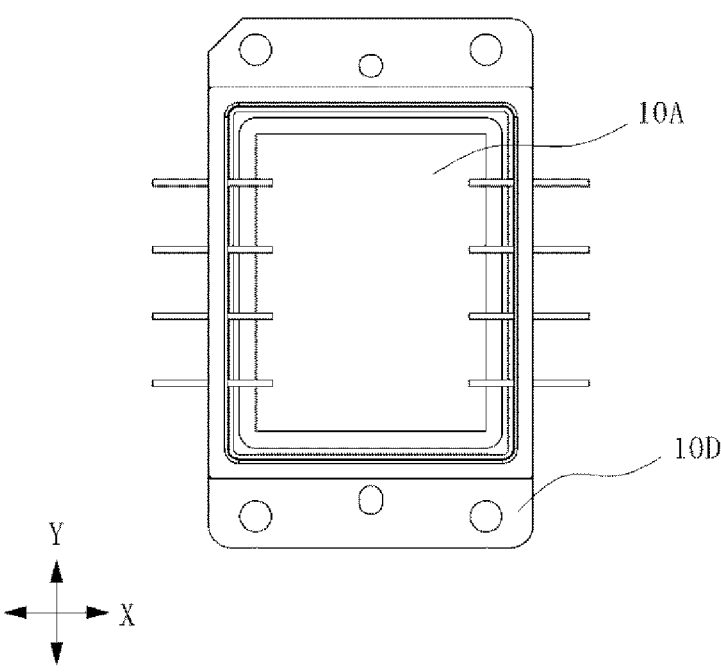
FIG. 5A is a schematic diagram for explaining the method of manufacturing the light-emitting device according to the embodiment.

The method of manufacturing the light-emitting device 1 can include a step of preparing the base structure 10 (see FIG. 5A). When the base structure 10 has the cover 13, the base structure 10 is prepared in a state where at least the cover 13 is not connected to the base portion 11 with the lateral portion 12 interposed. The base structure 10 may be prepared in a state with the base portion 11, the lateral portion 12, and the cover 13 as independent members, and may be prepared in a state with two members connected.

Figure 5B:
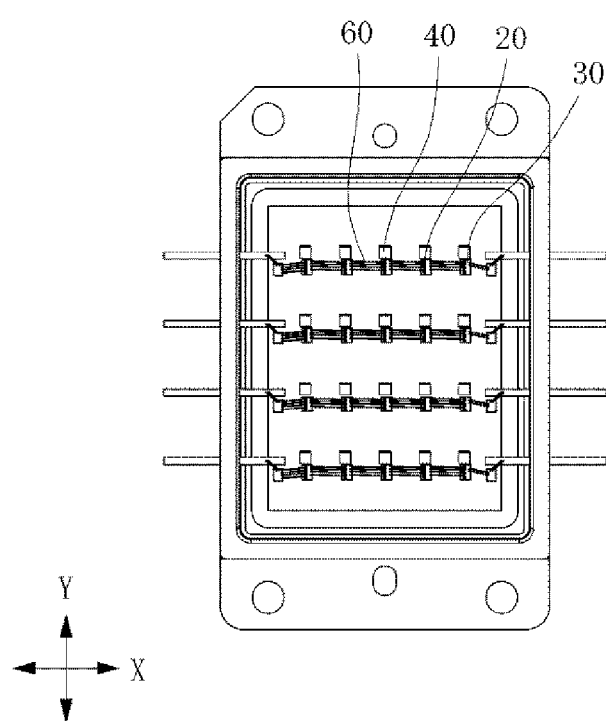
FIG. 5B is another schematic diagram for explaining the method of manufacturing the light-emitting device according to the embodiment.

The method of manufacturing the light-emitting device 1 includes the step of arranging the light-emitting element 20 on the base structure 10 (see FIG. 5B). One or a plurality of light-emitting elements 20 are arranged on the first upper surface 10A of the base structure 10. In this step, the plurality of light-emitting elements 20 can be arranged in N rows and M columns (where N is a natural number of one or greater, and M is 2 or greater). In the illustrated light-emitting device 1, the row direction and the X direction are parallel, and the column direction and the Y direction are parallel.

Light that travels in the direction parallel to the Y direction is emitted from the one or plurality of light-emitting elements 20. Light that travels in a direction that is not parallel with the Y direction may also be included in the light emitted from the light-emitting element 20. When the light from the light-emitting element 20 is laser light, it is possible to arrange the light-emitting element 20 so that the optical axis of the laser light is parallel to the Y direction, and the slow axis direction of the laser light is parallel to the X direction. It is also possible to arrange the light-emitting element 20 so that light that travels in the direction parallel to the Z direction from the light-emitting element 20 is emitted.

With the step of arranging the light-emitting element 20, it is also possible to arrange another constituent element rather than the light-emitting element 20. As the other constituent element, examples include the submount 30, the reflective member 40, and the wiring 60. These constituent elements are arranged before arranging or after arranging the light-emitting element 20. A plurality of constituent elements may be arranged, including the constituent elements arranged before the light-emitting element 20 is arranged, and the constituent elements arranged after the light-emitting element 20 is arranged.

The submounts 30 can be provided 1-to-1 with the light-emitting elements 20. One light-emitting element 20 is joined with one submount 30, and the submount 30 is directly joined to the base structure 10. A plurality of light-emitting elements 20 may also be joined to one submount 30.

The reflective members 40 can be provided 1-to-1 with the light-emitting elements 20. Light emitted from one light-emitting element 20 is reflected by one reflective member 40. The reflective member 40 reflects the light emitted from the light-emitting element 20. The light reflecting surface of the reflective member 40 reflects at least the main portion of the light. Light reflected by the light reflecting member 40 includes light that travels in the direction parallel to the Z direction. It is also possible to have light emitted from the plurality of light-emitting elements 20 be reflected by one reflective member 40.

To electrically connect the light-emitting elements 20, a plurality of wirings 60 are arranged. The one or plurality of light-emitting elements 20 are electrically connected to the base structure 10 by the plurality of wirings 60. The wirings 60 form a current path in which current flows to the light-emitting elements 20 through the lead pins of the base structure 10. It is also possible to have the plurality of light-emitting elements 20 arranged in the same row electrically connected in series using the wirings 60. The electrical connection mode need not be limited to this kind of series connection.

Figure 5C:
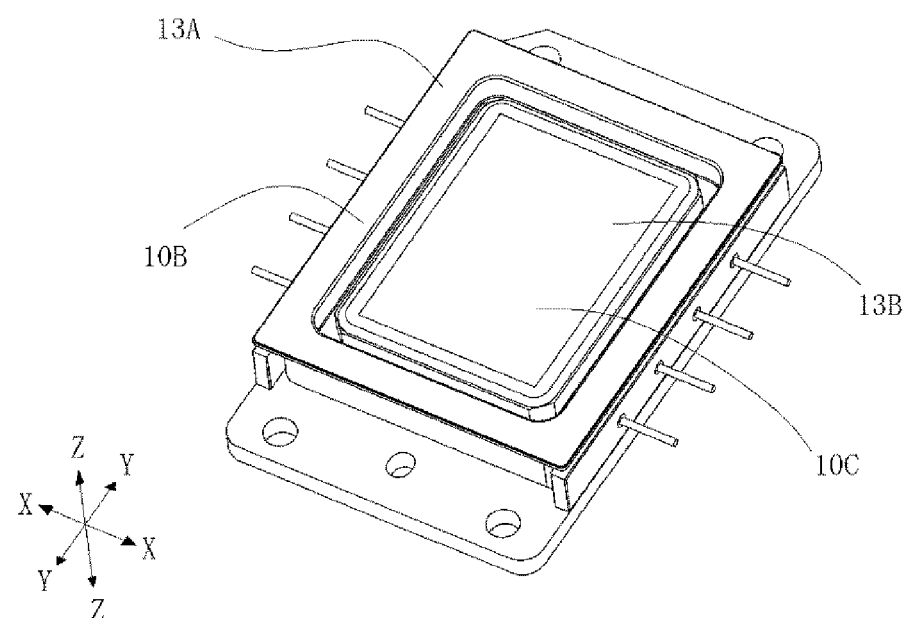
FIG. 5C is another schematic diagram for explaining the method of manufacturing the light-emitting device according to the embodiment.
Figure 5D:
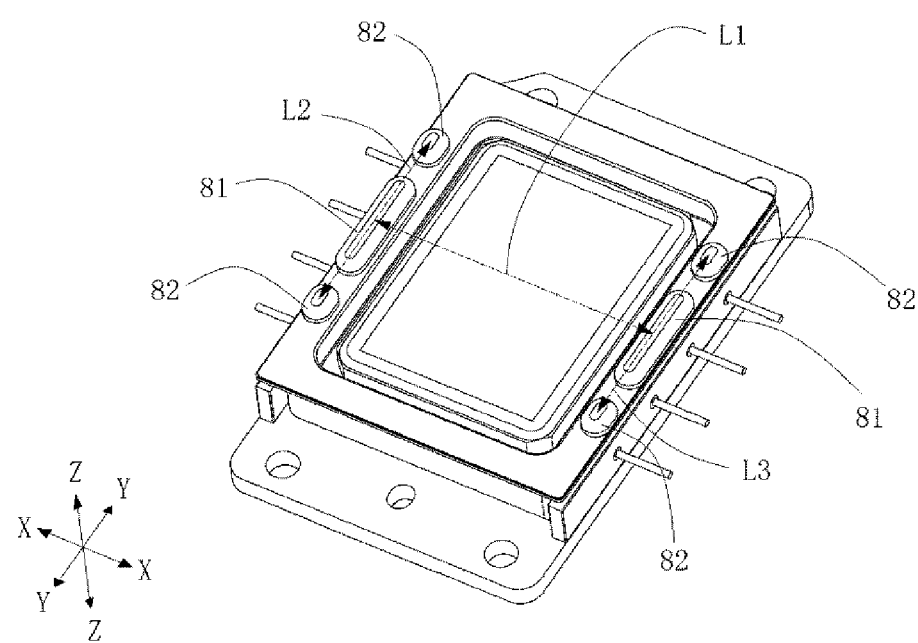
FIG. 5D is another schematic diagram for explaining the method of manufacturing the light-emitting device according to the embodiment.

When the base structure 10 has the cover 13, after the light-emitting elements 20 are arranged on the first upper surface 10A, the space in which the light-emitting elements 20 are placed is made to be a closed space by the cover 13 (see FIG. 5C). The cover 13 is connected to the lateral portion 12 of the base structure 10 and joined. The frame member 13A of the base structure 10 can be connected to the lateral portion 12 and joined. When the base structure 10 has the cover 13, the work of mounting the cover 13 in this way is also included in the step of arranging the light-emitting elements 20 on the base structure 10. When another constituent element is arranged in the closed space, the cover 13 is used to close it after the light-emitting elements 20 and the other constituent element are arranged inside the space in which it is planned to form the closed space.

In a state with the light-emitting elements 20 arranged on the base structure, the base structure 10 has the first side and second side of the second upper surface 10B arranged parallel to the Y direction, and the third side and fourth side to the X direction. All of the one or more light-emitting elements 20 emit light in the direction facing the third side in the top view.

The light-emitting device 1 can have a maximum number of rows or columns of 4 or more when the plurality of light-emitting elements 20 are arranged in N rows and M columns. To arrange 4 or more light-emitting elements 20 in alignment, it is preferable for the first upper surface 10A to have a width of 8.0 mm or greater in the alignment direction. For example, with ensuring this width at 8.0 mm or greater and 19.0 mm or less, 4 or more and 10 or less light-emitting elements 20 can be aligned and arranged on the first upper surface 10A. When aligning and arranging the light-emitting elements 20 and the reflective members 40 in the alignment direction of the 4 or more light-emitting elements 20, it is preferable for the first upper surface 10A to have a width of 12.0 mm or greater in the alignment direction of the 4 or more light-emitting elements 20. The width of the first upper surface 10A in the alignment direction of the 4 or more light-emitting elements 20 can be 8.0 mm or greater and 20.0 mm or less.

The method of manufacturing the light-emitting device 1 includes the step of providing an adhesive agent on the base structure 10. Instead of providing the adhesive agent on the base structure 10, it is also possible to provide it on the optical member 70. The light-emitting device 1 has the optical member 70 and the base structure 10 joined using the adhesive agent. An outer edge of a joint surface of the base structure 10 in contact with the adhesive agent is larger than the outer edge of the optical member 70. Providing the adhesive agent on the base structure 10 makes it easier to place the adhesive agent to the outer side.

The first adhesive agent 81 and the second adhesive agent 82 are provided on the second upper surface 10B of the base structure 10. The first adhesive agent 81 is provided at a plurality of locations of the second upper surface 10B. The first adhesive agent 81 is provided at least at one location each of a first region and a second region of the frame-shaped region. The first region and the second region are regions separated from each other. This state of this arrangement is maintained even when the first adhesive agent 81 is cured and becomes the first adhesive part 80A. In other words, the first adhesive part 80A is provided at a plurality of locations of the frame-shaped region, and is provided at least at one location each of the first region and the second region of the frame-shaped region.

Thus, as long as the state is maintained as described above, descriptions for "the first adhesive agent 81" can also be applied for "the first adhesive part 80A." Hereafter, when description for "the adhesive agent", "the first adhesive agent 81", "the second adhesive agents 82" can also be applied for "the adhesive part 80," "the first adhesive part 80A," and "the second adhesive parts 80B," respectively, such relationship will be referred to as the expression "the state is maintained."

The second adhesive agent 82 is disposed at least at two locations so as not to contact the first adhesive agent 81 provided in the first region, and to be located at both sides of the first adhesive agent 81 provided in the first region. The first region is located between the second adhesive agents 82 provided at these two locations. Said another way, the second adhesive agents 82 are provided outward of the first region in the top view. This state is maintained even when the adhesive agent is cured and becomes the adhesive part 80.

The second adhesive agent 82 is provided at least at two locations without contacting the first adhesive agent 81 provided in the second region, and such that the first adhesive agent 81 provided in the second region is located between the two locations. The second region is disposed between the second adhesive agents 82 provided at these two locations. Said another way, the second adhesive agents 82 are provided outside the second region in the top view. This state is maintained even when the adhesive agent is cured and becomes the adhesive part 80.

In the top view, a virtual line segment (first line segment L1) that connects points on the first adhesive agent 81 provided in each of the first region and the second region goes through the first upper surface 10A. In the top view, a virtual line segment (second line segment L2) that connects points on the two second adhesive agents 82 at both opposite sides of the first adhesive agent 81 provided in the first region does not extend across the first surface. In the top view, a virtual line segment (third line segment L3) that connects points on the two second adhesive agents 82 at both opposite sides of the first adhesive agent 81 provided in the second region does not extend across the first surface. The first adhesive agent 81 and the second adhesive agents 82 are provided to satisfy such an arrangement relationship. This state is maintained even when the adhesive agent is cured and becomes the adhesive part 80.

In the top view, the width of the direction parallel to the second line segment of the first adhesive agent 81 provided in the first region is greater than either width in the direction parallel to the second line segment of the two second adhesive agents 82 at both opposite sides of the first adhesive agent 81 provided in the first region. In the top view, the width of the direction parallel to the third line segment of the first adhesive agent 81 provided in the second region is greater than either width of the direction parallel to the third line segment of the two second adhesive agents 82 at both opposite sides of the first adhesive agent 81 provided in the second region. This allows the first adhesive agent 81 provided in one location and each of the second adhesive agents 82 provided in two locations at both opposite sides of the first adhesive agent 81 to have stable adhesive strength.

This state is maintained even when the adhesive agent is cured and becomes the adhesive part 80.

The width of the direction parallel to the second line segment of the first adhesive agent 81 provided in the first region is preferably within a range of 0.9 times to 1.1 times the width of the direction parallel to the third line segment of the first adhesive agent 81 provided in the second region. This allows for reducing difference between the adhesive strength by the first adhesive agent 81 provided in the first region and the adhesive strength by the first adhesive agent 81 provided in the second region, which improves the balance of the adhesive strengths. This state is preferably maintained even when the adhesive agent is cured and becomes the adhesive part 80.

Two of the second adhesive agents 82, for which in the top view, a line segment that connect the two second adhesive agents 82 intersects the first line segment on the upper surface 10A, are preferably applied on the second upper surface 10B such that an area of one of the two second adhesive agents 82 is within a range of 0.9 times to 1.1 times of the other of the two second adhesive agents 82. Such an arrangement allows well-balanced adhesion.

The first adhesive agent 81 is provided one each on the first side and the second side. The first adhesive agent 81 may also be provided at a plurality of locations on the first side or the second side, or may be provided on the third side or the fourth side. The first region is included in a region that forms the first side of the frame-shaped region. The second region is included in a region that forms the second side of the frame-shaped region.

In the top view, a virtual line that goes through the middle point of the first side and is perpendicular to the first side passes through the first adhesive agent 81 provided in the first region and the first adhesive agent 81 provided in the second region. This state is maintained even when the adhesive agent is cured and becomes the adhesive part 80.

In the top view, the plurality of light-emitting elements 20 can be arranged in a matrix form of 3 or more rows and 2 or more columns, with the direction perpendicular to the first side as the row direction, and the direction perpendicular to the first side as the column direction. This kind of matrix form arrangement of 3 or more rows and 2 or more columns shall be referred to as a first matrix arrangement.

In the first matrix arrangement, in the top view, the first adhesive agent 81 is provided between a virtual straight line (hereafter called a first virtual line) that passes through the plurality of light-emitting elements 20 arranged in one row of the rows at both ends, and a virtual straight line (hereafter called a second virtual line) that passes through the plurality of light-emitting elements 20 arranged in the other row. This state is maintained even when the adhesive agent is cured and becomes the adhesive part 80.

In the first matrix arrangement, in the top view, one of the two second adhesive agents 82 at both opposite sides of the first adhesive agent 81 is provided between a virtual straight line (hereafter called a third virtual line) that passes through the plurality of light-emitting elements arranged in the row adjacent to one row of the rows at both ends, and a virtual straight line that extends along the third side and is parallel to the third side. The one of the two second adhesive agents 82 at both opposite sides of the first adhesive agent 81 is provided between the third virtual line, and a virtual straight line that extends along the inner edge of the third side and is parallel to the inner edge of the third side. This state is maintained even when the adhesive agent is cured and becomes the adhesive part 80.

In the first matrix arrangement, in the top view, the other of the two second adhesive agents 82 at both opposite sides of the first adhesive agent 81 is provided between a virtual straight line (hereafter called a fourth virtual line) that passes through the plurality of light-emitting elements arranged in the row adjacent to the other row of the rows at both ends, and a virtual straight line that extends along the fourth side and is parallel to the fourth side. The other of the two second adhesive agents 82 that at both opposite sides of the first adhesive agent 81 is provided between the fourth virtual line and a virtual straight line that extends along the inner edge of the fourth side and is parallel to the fourth side. This state is maintained even when the adhesive agent is cured and becomes the adhesive part 80.

In the top view, the first adhesive agent 81 and the second adhesive agents 82 are provided in a portion of the region (an adhesive region) on the frame-shaped region between the virtual line perpendicular to the first side that extend along the inner edge of the third side, and the virtual line perpendicular to the first side that extend along the inner edge of the fourth side. The first adhesive agent 81 and the second adhesive agents 82 are not provided in the region other than this region (the adhesive region) on the frame-shaped region. This state is maintained even when the adhesive agent is cured and becomes the adhesive part 80.

The method of manufacturing the light-emitting device 1 includes the step of fixing the optical member 70 to the base structure 10 using the adhesive agent. This step includes a step of curing the first adhesive agent 81, and a step of curing the second adhesive agents 82 after the first adhesive agent 81 is cured.

With the step of curing the first adhesive agent 81, the first adhesive agent 81 is cured in a state with the optical member 70 in contact with the first adhesive agent 81 and the second adhesive agents 82. In this way, the first adhesive agent 81 is cured, and the first adhesive part 80A is formed. The base structure 10 and the optical member 70 are joined with the first adhesive part 80A interposed. At this time, the state is such that the first adhesive agent 81 is solidified, and the second adhesive agents 82 are not solidified. Even in this state, the optical member 70 is fixed to the base structure 10.

In the step of curing the second adhesive agents 82, the second adhesive agents 82 that are in a state in contact with the optical member 70 are cured. In this way, the second adhesive agents 82 are cured, and the second adhesive parts 80B are formed. The base structure 10 and the optical member 70 are joined with the second adhesive parts 80B interposed. The optical member 70 is fixed to the base structure 10 with the first adhesive part 80A and the second adhesive parts 80B interposed.

In the manufacturing of the light-emitting device 1, application amount [g] of the first adhesive agent 81 is greater than application amount of the second adhesive agents 82. Overall application amount [g] of the first adhesive agent 81 is greater than overall application amount of the second adhesive agents 82 with respect to the first adhesive agent 81 and the second adhesive agents 82 provided at a plurality of locations. This allows for improving the bonding stability by curing the first adhesive agent 81.

The application amount of the first adhesive agent 81 is preferably 30 mg or greater and 70 mg or less. When the application amount of the first adhesive agent 81 is too small, it is difficult to stably fix the optical member 70 to the base structure 10 with the first adhesive agent 81 alone. When the application amount of the first adhesive agent 81 is too great, it more easily contacts the second adhesive agents 82. Because the second upper surface 10B is provided in a state with neither the first adhesive agent 81 nor the second adhesive agents 82 cured, it is best to not have contact between the first adhesive agent 81 and the second adhesive agents 82.

The application amount of the second adhesive agent 82 is preferably 20 mg or greater and 35 mg or less. The same as with the first adhesive agent 81, it is possible to stabilize joining, and reduce risk of contact with the first adhesive agent 81.

It is possible to arrange the optical member 70 for which the outer edge is an octagon in the top view so that one side of the octagon is positioned on the first side, and another side of the octagon is positioned on the second side. The two second adhesive parts 80B at both opposite sides of the first adhesive part 80A provided in the first region are provided at both ends of the one side of the octagon positioned on the first side, and the two second adhesive parts 80B at both opposite sides of the first adhesive part 80A provided in the second region are provided at both ends of the one side of the octagon positioned on the second side. By forming the second adhesive parts 80B at both ends of the side of the optical member 70, it is possible to adhere the optical member 70 with good balance.

Fixing of the optical member 70 to the base structure 10 is not limited to the method of providing the adhesive agents on the upper surface of the base structure 10 and fixing the optical member 70. For example, it is possible to use the lateral portion 12 of the base structure 10 to fix the optical member 70. At this time, it is possible to use the inner lateral surface of the lateral portion 12 for joining with the optical member 70. As long as the adhesive agent has a certain degree of viscosity, it is possible to interpose the adhesive agent between the outer lateral surface of the optical member 70 and the inner lateral surface of the base structure 10 and fix the optical member 70 to the base structure 10. In this case, the first region and the second region are provided respectively on the inner lateral surface facing the base structure 10. Therefore, the light-emitting device 1 according to the present embodiment is not limited to the illustrated mode, and may also be a mode in which the first adhesive part 80A and the second adhesive parts 80B are formed on the surface on which the first region is provided, and the surface on which the second region is provided. It is possible to configure the surface on which the first region is provided and the surface on which the second region is provided as separate surfaces, and also possible to configure as one connected surface. In any of these cases, a surface or surfaces with the first region and the second region is located above the first upper surface 10A.

The light emitted from the one or plurality of light-emitting elements 20 passes through the optical characteristics region of the optical member 70. In the illustrated light-emitting device 1, the light emitted from the light-emitting elements 20 is reflected by the reflective members 40, and passes through the lens surface of the optical member 70. The light emitted from the plurality of light-emitting elements 20 arranged in matrix form in N rows and M columns passes through the plurality of lens surfaces placed in the matrix form of N rows and M columns. The main portion of light from one light-emitting element 20 passes through one lens surface.

Light that passed through the optical member 70 is collimated, and is emitted from the optical member 70. The light-emitting device 1 emits one or a plurality of collimated lights. Alternatively, the light-emitting device 1 may emit light that is not collimated. By allowing light to be incident precisely on the optical characteristics region, it is possible to perform the intended optical control. In the example of the illustrated light-emitting device 1, the adhesive part 80 is provided in a region that does not overlap the lens surface of the optical member 70 in the top view. This enables optical design in which the adhesive part 80 does not interfere with the light path of the light made incident on the optical characteristics region.

Figure 6:
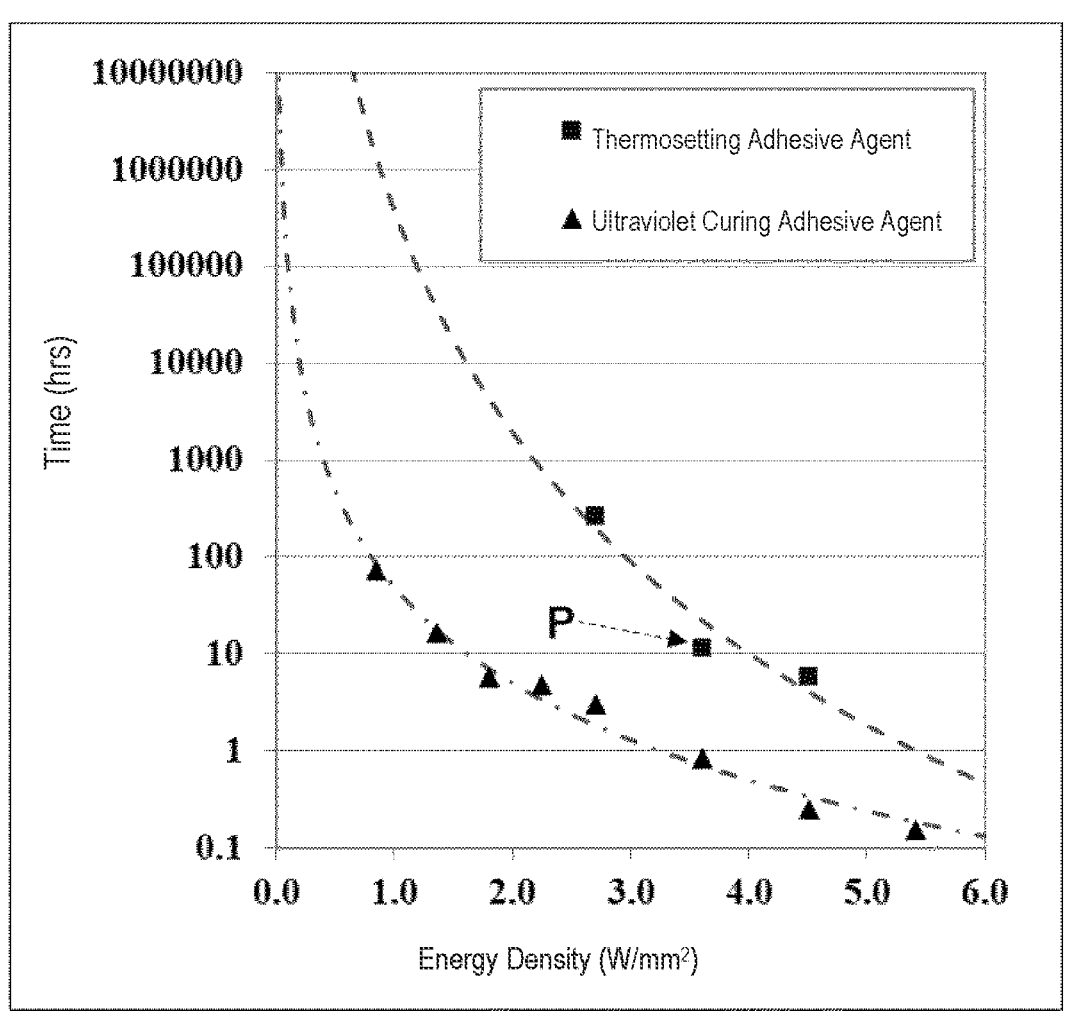
FIG. 6 is a graph showing results of the experiment in which the resistance of an adhesive agent to light was measured.

In the description below, experiment results relating to resistance of the first adhesive agent 81 and the second adhesive agents 82 to light are shown. FIG. 6 shows the experiment results of measuring the time until each adhesive part is burned when, in a state in which an optical member is arranged on metal, this optical member is joined respectively by the first adhesive agent 81 and the second adhesive agents 82, and the first adhesive part and the second adhesive parts are formed, laser light is emitted from above, and goes through the optical member to irradiate the adhesive agent. FIG. 6 is a graph of the correlation of the energy density (W/mm$^2$) of the light irradiated on the adhesive parts and the time (hours) until they are burnt.

In this experiment, a thermocouple is installed near the adhesive parts, and the temperature changes of the thermocouple was measured. The temperature was adjusted assuming a state when the light-emitting device 1 was actually operated. In the measurement results, the thermocouple temperature started to rise rapidly at a certain point from the stable state, causing a temperature rise of 2 to 3 degrees or more. Also, when the adhesive parts were observed, the adhesive parts were discolored to black.

Figure 7:
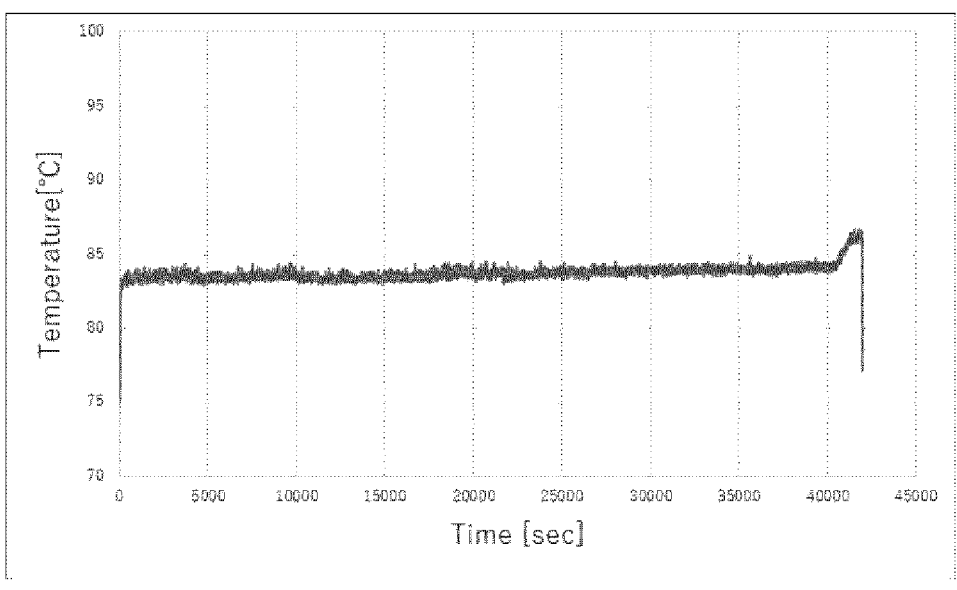
FIG. 7 is a graph showing the measurement result of the resistance of the adhesive agent to light.
Figure 8:
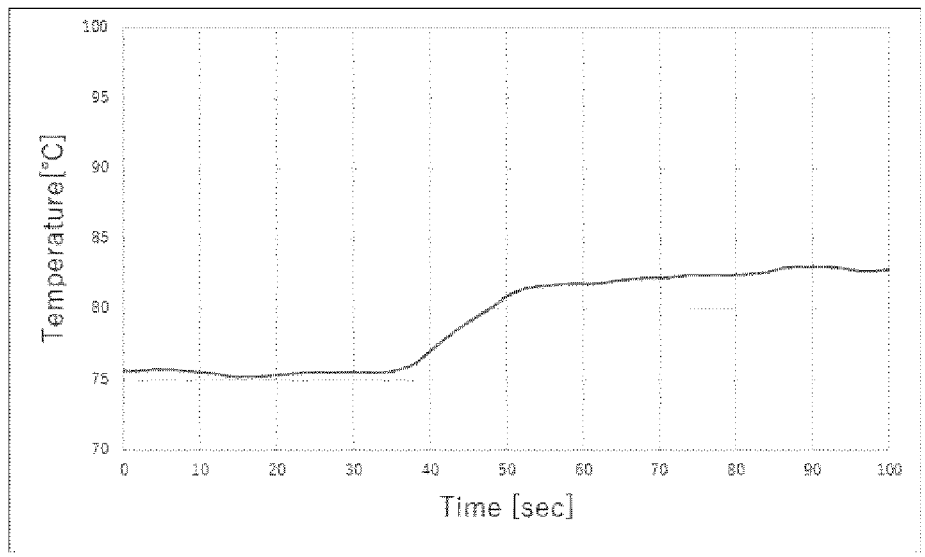
FIG. 8 is a graph showing the measurement result of the resistance of the adhesive agent to light.
Figure 9:
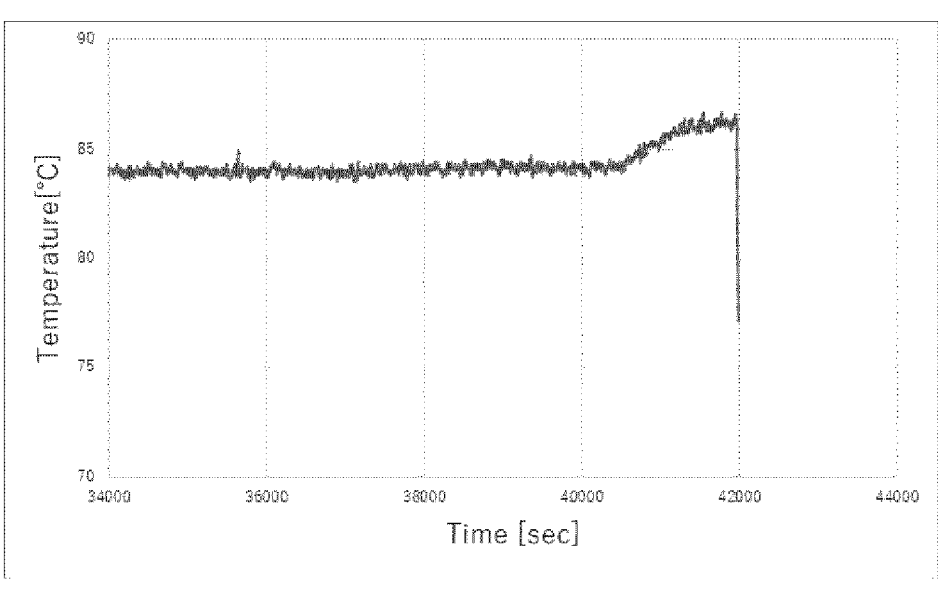
FIG. 9 is a graph showing the measurement result of the resistance of the adhesive agent to light.

The measurement results in plot P shown in FIG. 6 are shown in FIG. 7 to FIG. 9. With this measurement, the ambient temperature of the adhesive part was adjusted to 75 degrees before starting measurement. Also, before starting measurement, laser light was irradiated after confirming that the temperature of the thermocouple had stabilized near 75 degrees. As shown in FIG. 8, at the point when 30 to 40 seconds elapsed from measurement start, laser light irradiation was started, and the temperature of the thermocouple rose to around 82 degrees as a result.

The temperature rise due to laser light irradiation became eased around 82 degrees, and stabilized at a roughly constant temperature. As shown in FIG. 7, there was a slight rise over a long time.

At the point exceeding 40,000 seconds, the temperature started to rise suddenly from the stabilized state. Measurement ended at the point of 42,000 seconds, and at this time, it was confirmed that the adhesive parts were discolored to black.

From this result, it was surmised that a temperature rise was caused for the adhesive part by irradiation of light, and that burning occurred. In light of that, the point when a rapid rise in the thermocouple temperature started from the stable state was estimated to be the point when burning of the adhesive part started occurring, and the irradiation time until this point was set as the time until the adhesive agent burns, with experiment results shown in FIG. 6.

As can be understood from the results in FIG. 6, when using the first adhesive agent 81, the first adhesive part burned within 100 hours with respect to irradiation of light of energy density 1.0 (W/mm$^2$). For that reason, depending on the product in which the light-emitting device is mounted, there may be a need for a light-emitting device with better resistance to light than this.

It is also understood that the second adhesive agent 82 has better resistance to light than the first adhesive agent 81. Therefore, even if the first adhesive part is burnt and cannot maintain adhesive strength, fixing of the optical member 70 is maintained in the light-emitting device 1. Therefore, it is possible to realize the light-emitting device 1 with a stable adhesion state even after long term use.

The first adhesive agent 81 and the second adhesive agent 82 are not limited to the items used in the experiment, and any suitable adhesive agent may be selected. From the experiment results, examples of the following combinations can be considered as the first adhesive agent 81 and the second adhesive agent 82 used in the light-emitting device 1.

One example is a combination of the first adhesive agent 81 in which the adhesive part burns within 10 hours with respect to irradiation of light of a predetermined density, and the second adhesive agent 82 in which the adhesive part does not burn at 100 hours. With the experiment of FIG. 6, while the adhesive part of the first adhesive agent 81 burns at 3 hours with respect to irradiation of light of energy density 2.7 (W/mm$^2$), the adhesive part of the second adhesive agent 82 did not burn even after 250 hours elapsed.

Another example is a combination of the first adhesive agent 81 in which the adhesive part burns within one hour with respect to irradiation of light of a predetermined energy density, and the second adhesive agent 82 in which the adhesive part does not burn at 10 hours. With the experiment in FIG. 6, while the adhesive part of the first adhesive agent 81 burned at 50 minutes with respect to irradiation of light of energy density 3.6 (W/mm$^2$), the adhesive part of the second adhesive agent 82 did not burn even when 11 hours elapsed.

Another example is a combination of the first adhesive agent 81 in which the adhesive part burns within 30 minutes with respect to irradiation of light of a predetermined energy density, and the second adhesive agent 82 in which the adhesive part does not burn at 5 hours. With the experiment in FIG. 6, while the adhesive part of the first adhesive agent 81 burned at 15 minutes with respect to irradiation of light of energy density 4.5 (W/mm$^2$), the adhesive part of the second adhesive agent 82 did not burn even after 5 hours elapsed.

The second adhesive agent 82 has better resistance than the first adhesive agent 81 at least with respect to irradiation of light in a range of energy density of 5.0 (W/mm$^2$) or less. Though it also depends on the environment in which the light-emitting device 1 is mounted, it is preferable that the second adhesive agent 82 have better resistance to light than the first adhesive agent 81 at least with respect to irradiation of light in a range of energy density of 1.0 (W/mm$^2$) or less.

In the light-emitting device 1, by providing the second adhesive parts 80B at both opposite sides of the first adhesive part 80A, even when the adhesive strength by the first adhesive part 80A is lost, it is possible to reduce displacement of the optical member 70.

By placing the second adhesive parts 80B roughly symmetrically from the first adhesive part 80A, balance is maintained with or without the adhesive strength of the first adhesive part 80A. For example, even if a load is applied to the second adhesive parts 80B that join the optical member 70 and the base structure 10 due to temperature changes in the operating environment, an excessively large load is not exerted on one of the two second adhesive parts 80B compared to the other.

When there is a big difference in load, a difference occurs in the adhesive strength between the two locations of the second adhesive parts 80B, so rotational deviation of the optical member 70 may occur. By adhering the optical member 70 by providing the adhesive agents with good balance as described above, it is possible to suppress position displacement which effects the optical characteristics region, and to realize the light-emitting device 1 with a stable adhesion state.

While one embodiment of the present invention has been explained above, the light-emitting device of the present invention is not strictly limited to the light-emitting device of the embodiment described above. In other words, the present invention is not prevented from being realized without being limited to the outer shape or structure of the light-emitting device disclosed in the embodiment. This can also be applied without requiring provision of a sufficient amount of all the constituent elements. For example, when one of the constituent elements of the light-emitting device disclosed in the embodiment above are not described in the claims, the freedom of design such as replacement, omission, change in shape or material, etc., by a person skilled in the art is allowed for that constituent element, and it is specified that the invention described in the claims is applied.

The light-emitting device described in the embodiment can be used for a projector, a vehicle headlight, a head mounted display, lighting, a display, etc.

What is claimed is:

1. A light-emitting device comprising:
a base structure having a first surface, and a second surface positioned higher than the first surface, the second surface having a rectangular frame shape surrounding the first surface in a top view, the second surface including a first region and a second region;
one or more light-emitting elements arranged on the first surface;
an optical member bonded to the base structure so as to at least partially overlap the first surface in the top view;
a plurality of first adhesive parts formed by curing a first adhesive agent, the first adhesive parts being disposed respectively in the first region and the second region of the second surface at positions between the second surface and the optical member and fixing the optical member to the base structure, the first adhesive parts not being disposed at corners of the rectangular frame shape of the second surface; and
a plurality of second adhesive parts formed by curing a second adhesive agent different from the first adhesive agent, the second adhesive parts being disposed such that a pair of the second adhesive parts are respectively located at both opposite sides of a corresponding one of the first adhesive parts in the first region on the second surface without being in contact with the corresponding one of the first adhesive parts and another pair of the second adhesive parts are respectively located at both opposite sides of a corresponding one of the first adhesive parts in the second region on the second surface without being in contact with the corresponding one of the first adhesive parts, the second adhesive parts not being disposed at the corners of the rectangular frame shape of the second surface, wherein
in the top view, a virtual first line segment, which connects two points respectively on the first adhesive parts in the first region and the second region, extends across the first surface,
in the top view, a virtual second line segment, which connects two points respectively on the pair of the second adhesive parts at the both opposite sides of the corresponding one of the first adhesive parts in the first region, does not extend across the first surface,
in the top view, a virtual third line segment, which connects two points respectively on the another pair of the second adhesive parts at the both opposite sides of the corresponding one of the first adhesive parts in the second region, does not extend across the first surface,
in the top view, a width of the corresponding one of the first adhesive parts in the first region in a direction parallel to the second line segment is greater than a width of each of the pair of the second adhesive parts at the both opposite sides of the corresponding one of the first adhesive parts in the first region in the direction parallel to the virtual second line segment, and
in the top view, a width of the corresponding one of the first adhesive parts in the second region in a direction parallel to the third line segment is greater than a width of each of the another pair of the second adhesive parts at the both opposite sides of the corresponding one of the first adhesive parts in the second region in the direction parallel to the virtual third line segment.

2. The light-emitting device according to claim 1, wherein in the top view,
the first region is a part of a region of the second surface defining a first side of the rectangular frame-shape, and a second region is a part of a region of the second surface defining a second side of the rectangular frame-shape opposite to the first side.

3. The light-emitting device according to claim 2, wherein the rectangular frame-shape has a pair of long sides and a pair of short sides, and
the first side and the second side are the long sides of the rectangular frame-shape.

4. The light-emitting device according to claim 2, wherein in the top view, a virtual line, which extends through a middle point of the first side and is perpendicular to the first side, extends across the corresponding one of the first adhesive parts in the first region and the corresponding one of the first adhesive parts in the second region.

5. The light-emitting device according to claim 2, wherein the one or more light-emitting elements include a plurality of light-emitting elements that are arranged in a matrix form of 3 or more rows and 2 or more columns, each row extending in a row direction perpendicular to the first side, each column extending in a column direction parallel to the first side,
in the top view, at least one of the first adhesive parts is located between a virtual straight line, which passes through the light-emitting elements arranged in one outermost row among the rows of the light-emitting elements, and a virtual straight line, which passes through the light-emitting elements arranged in the other outermost row among of rows of the light-emitting elements,
in the top view, one of the pair of the second adhesive parts at the both opposite sides of the at least one of the first adhesive parts is located between a virtual straight line, which passes through the light-emitting elements arranged in a row adjacent to the one outermost row, and a virtual straight line, which passes through and extends along a third side of the rectangular frame-shape, and
in the top view, the other of the pair of the second adhesive parts at the both opposite sides of the at least one of the first adhesive parts is located between a virtual straight line, which passes through the light-emitting elements arranged in a row adjacent to the other outermost row, and a virtual straight line, which passes through and extends along a fourth side of the rectangular frame-shape.

6. The light-emitting device according to claim 5, wherein
in the top view, one of the first adhesive parts and a
corresponding pair of the second adhesive parts are
located only in an adhesive region of the second surface
between a virtual line, which, of inner edges of the
second surface having the rectangular frame-shape,
extends along one of the inner edges corresponding to
the third side and is perpendicular to the first side, and
the virtual line, which extends along one of the inner
edges corresponding to the fourth side and is perpen-
dicular to the first side, and
the first adhesive parts and the second adhesive parts are
not located in regions other than the adhesive region of
the second surface.
7. The light-emitting device according to claim 6, wherein
in the top view, the optical member has outer edges
defining an octagonal shape, with one side of the
octagonal shape positioned on the first side, and one
side of the octagonal shape positioned on the second
side,
the pair of the second adhesive parts at the both opposite
sides of the corresponding one of the first adhesive
parts in the first region are located at both ends of the
one side of the octagonal shape positioned on the first
side, and

22 the another pair of the second adhesive parts at the both
opposite sides of the corresponding one of the first
adhesive parts in the second region are located at both
ends of the one side of the octagonal shape positioned
on the second side.
8. The light-emitting device according to claim 1, wherein
the first adhesive agent is an ultraviolet curing resin
adhesive agent, and
the second adhesive agent is a thermosetting resin adhe-
sive agent.
9. The light-emitting device according to claim 1, wherein
the base structure includes
a base portion having the first surface,
a lateral portion connected to the base portion and
surrounding the first surface in the top view, and
a cover having the second surface and connected to the
lateral portion.
10. The light-emitting device according to claim 9,
wherein
the cover includes
a frame member formed of a metal as a main material,
the frame member being bonded to the lateral por-
tion, and
a light-transmissive member bonded to the frame mem-
ber.

* * * * *